United States Patent [19]

Sato et al.

[11] Patent Number: 5,374,896
[45] Date of Patent: Dec. 20, 1994

[54] DISTORTION COMPENSATING CIRCUIT OF HIGH-FREQUENCY POWER AMPLIFIER

[75] Inventors: Hideaki Sato, Saitama; Sachio Iida, Chiba, both of Japan

[73] Assignee: Sony Corporation, Tokyo, Japan

[21] Appl. No.: 171,660

[22] Filed: Dec. 21, 1993

[30] Foreign Application Priority Data

Dec. 25, 1992 [JP] Japan .................. 4-359393

[51] Int. Cl.$^5$ ............... H03F 1/30; H03G 3/32
[52] U.S. Cl. .................... 330/149; 330/136
[58] Field of Search ............ 330/129, 136, 149; 307/492, 493

[56] References Cited

U.S. PATENT DOCUMENTS

| 4,188,587 | 2/1980 | Palmer | 330/136 |
| 4,263,560 | 4/1981 | Ricker | 330/129 |

FOREIGN PATENT DOCUMENTS

| 0441580A2 | 8/1991 | European Pat. Off. | H04B 1/04 |
| 2173074A | 1/1986 | United Kingdom | H04B 1/02 |

OTHER PUBLICATIONS

Telecommunications and Radio Engineering, vol. 44, No. 4, Apr. 1989, Washington, pp. 98-100, V. G. Lavrushenkov et al.: "The Features of Using Balanced Envelope Feedback in Power Amplifiers."
Patent Abstracts of Japan, vol. 9, No. 240 (E-245) (1963), 26 Sep. 1985, & JP-A-60 090 409 (Matshushita Denki Sangyo K.K.), 21 May 1985.
Patent Abstracts of Japan, vol. 12, No. 3 (E-570), 7 Jan. 1988 & JP-A-62 163 407 (Hitachi Ltd.), 20 Jul. 1991.
Patent Abstracts of Japan, vol. 15, No. 387 (E-1117), 30 Sep. 1991 & JP-A-03 155 210 (NEC Corp), 3 Jul. 1991.

*Primary Examiner*—Steven Mottola
*Attorney, Agent, or Firm*—Limbach & Limbach

[57] ABSTRACT

A high-frequency power amplifier in which the negative feedback control system linearity is maintained and non-linear distortion is stably compensated has: a variable gain circuit, disposed as a prestage of the power amplifier, in which the control voltage vs. gain characteristic is an inverse logarithm characteristic, which performs variable control on the level of the input signal supplied to the power amplifier; a gain detecting circuit, which detects the combined gain of the high frequency power amplifier and the variable gain circuit; and a loop filter, which supplies the output signal of this gain detecting circuit to the variable gain circuit as a control voltage. This gain detecting circuit includes: a first logarithmic convertor circuit, which performs logarithmic conversion on an envelope detection signal of the signal inputted into the variable gain circuit; a second logarithmic convertor circuit, which performs logarithmic conversion on an envelope detection signal of the output signal of the high-frequency power amplifier; and a subtraction circuit, which outputs the differential, or subtraction, signal of the output signals of the first and second logarithmic conversion circuits.

5 Claims, 12 Drawing Sheets

DISTORTION COMPENSATING CIRCUIT OF HIGH-FREQUENCY POWER AMPLIFIER

BACKGROUND OF THE INVENTION

1. Field of Industrial Use

The present invention relates to a distortion compensating circuit of a high-frequency power amplifier of the kind used in transmitter apparatus and the like.

2. Description of the Prior Art

Figure 1:
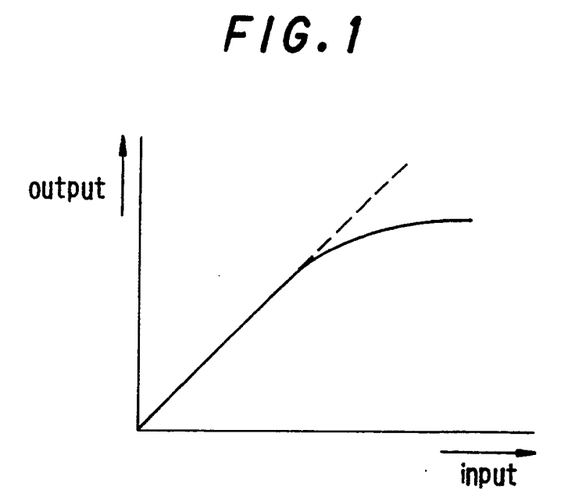
FIG. 1 is a characteristic diagram illustrating an input/output characteristic of a power amplifier.

Because the input/output characteristic of a power amplifier generally is a non-linear characteristic such as that shown in FIG. 1 by a solid line, this characteristic produces non-linear distortion (waveform distortion) dependent on the signal amplitude. In particular, in devices such as portable telephones, because the power source is a battery and low voltage operation is required, when driven at low voltages the non-linear characteristic becomes marked, and non-linear distortion readily occurs.

As methods for compensating this non-linear distortion, the negative feedback method, the predistorter method, and the feed-forward method are being studied.

Figure 2:
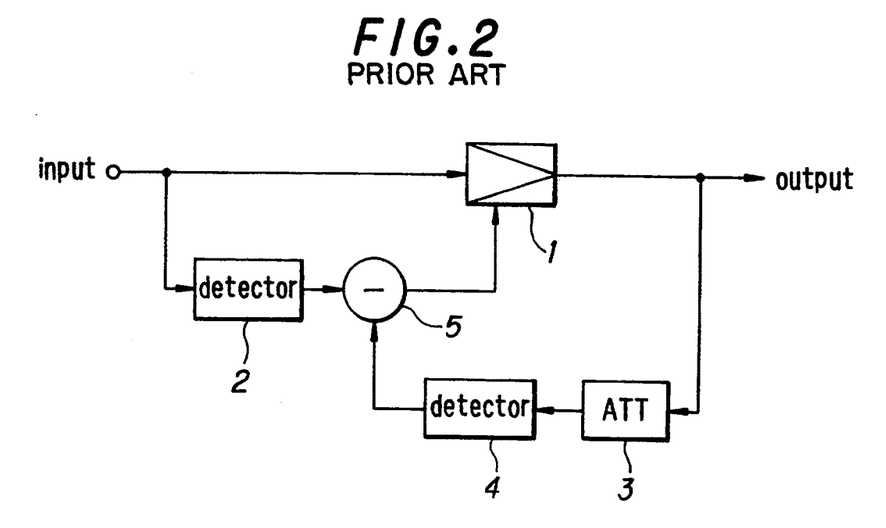
FIG. 2 is a system diagram showing an example of the prior art.

FIG. 2 shows the distortion compensating circuit of the conventional negative feedback method. In this method, the input signal is supplied to the power amplifier 1 and to an envelope detecting circuit 2, and a detection signal showing the envelope waveform of the input signal is derived. And, after the output signal of the amplifier 1 has been brought to the same level as the input signal by an attenuator circuit 3, it is supplied to an envelope detecting circuit 4, and a detection signal showing the envelope waveform of the output signal is derived. Then, the detection signals of the detecting circuits 2 and 4 are supplied to a subtracting circuit 5 and the difference component between these signals, i.e. the non-linear distortion component, is detected. For instance, the power source voltage of the amplifier 1 is controlled based upon this distortion component, and the amplifier gain is thereby controlled. As a result, an output signal which has been power-amplified and compensated for non-linear distortion is derived from the amplifier 1.

Figure 3:
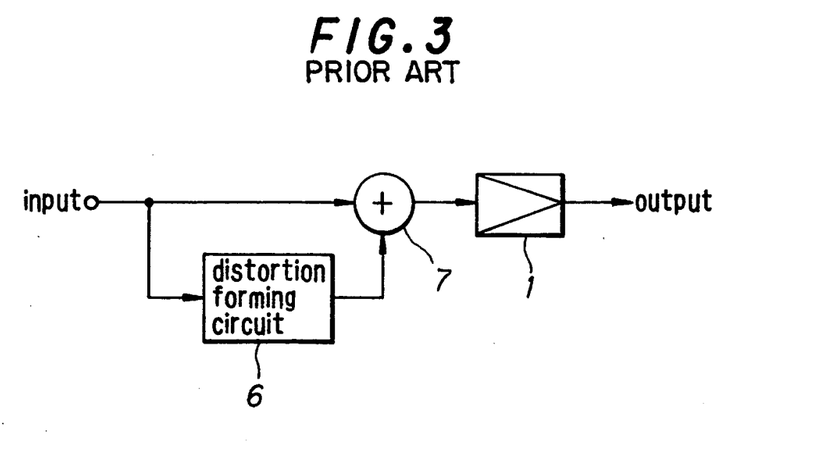
FIG. 3 is a system diagram showing an example of the prior art.

FIG. 3 shows the distortion compensating circuit of the predistorter method of the conventional technology. In this method, an input signal is supplied to a distortion forming circuit 6, and a distortion signal for canceling the non-linear distortion generated in the power amplifier 1 is produced. This distortion signal is added to the originally supplied input signal in an adding circuit 7, and thereafter is supplied to the power amplifier 1.

Figure 4:
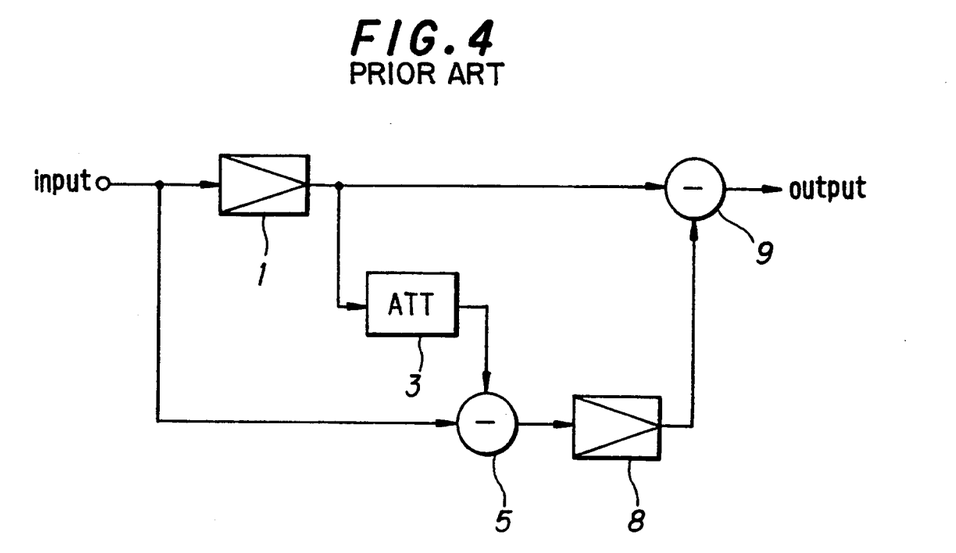
FIG. 4 is a system diagram showing an example of the prior art.

FIG. 4 shows the distortion compensating circuit of the feed-forward method of the conventional technology. In this method, the differential component between the input signal of the amplifier 1 and the output signal thereof, i.e. the non-linear distortion component, is detected by a subtraction circuit 5. This distortion component is amplified to the level of the non-linear distortion component contained in the output signal of the amplifier 1 by an amplifier 8, and is then supplied to a subtraction circuit 9, and the non-linear distortion component contained in the output signal of the amplifier 1 is removed.

With the negative feedback method, even when the parameters of the amplifier 1 change due to temperature characteristics or age deterioration, etc., the distortion compensating characteristic hardly deteriorates at all; however, because the negative feedback method is a closed loop control method, when the linearity of the loop is not maintained, its operation can become unstable and oscillation can occur. Then, when the power source voltage and thereby the gain of the amplifier 1 is controlled based upon the distortion detection output from the subtraction circuit 5, the change in the gain of the amplifier 1 with respect to this detection output does not become linear. Therefore, with the negative feedback method, in order to avoid such oscillation and maintain stable operation, the loop gain must be kept low. As a result, the distortion compensating amount cannot be made large.

As to this point, with the predistorter method and the feed-forward method, because both of these methods involve open-loop control, there is no stability problem. However, if the parameters of the amplifier 1 change due to the temperature characteristics or age deterioration, the distortion compensating characteristic deteriorates. Furthermore, with the feed-forward method, the distortion component must be faithfully amplified by the amplifier 8, and linearity of the amplifier 8 is required.

The present invention aims to solve these problems.

As previously described, the non-linear distortion which occurs in the power amplifier 1 is caused by non-linearity of the input/output characteristic of the power amplifier 1. From a different point of view, it may be conceived that such non-linear distortion is caused by gain error of the power amplifier 1. Then, if it is gain error that causes the non-linear distortion, by detecting the gain error and correcting the level of the input signal based upon the detected gain error, the gain error can be canceled.

This invention uses this approach to compensate for the non-linear distortion of a power amplifier.

Specifically, in the present invention, in a distortion compensating circuit of a high-frequency power amplifier 13 for compensating the non-linear distortion of the high-frequency power amplifier 13 by negative feedback, there are provided (the reference numerals correspond to components of the preferred embodiments discussed hereinafter): a variable gain circuit 12, provided at a front stage of the high-frequency power amplifier, for variable-controlling the level of an input signal S12 to be supplied to the high-frequency power amplifier 13; a gain detecting circuit 25 for detecting the gain of the high-frequency power amplifier 13; and a loop filter 28 for supplying the output signal S24 of this gain detecting circuit 25 to the variable gain circuit 12 as a control voltage thereof. The gain detecting circuit 25 is made up of: a first logarithm converting circuit 22 for logarithmically converting an envelope detection signal S21 of a signal S11 inputted into the variable gain circuit 12; a second logarithm converting circuit 23 for logarithmically converting an envelope detection signal S27 of an output signal S13 from the high-frequency power amplifier; and a subtraction circuit 24 for outputting a subtraction signal S24 of the respective output signals S22 and S23 of the first and second logarithm converting circuits 22 and 23. The control voltage vs. gain characteristic of the variable gain circuit 12 has an inverse logarithm characteristic.

The non-linear distortion of the high-frequency power amplifier 13 is detected, and this detection signal S24 is negative-fed back to the variable-gain circuit 12, and the non-linear distortion is compensated.

DESCRIPTION OF THE PREFERRED EMBODIMENTS

Figure 5:
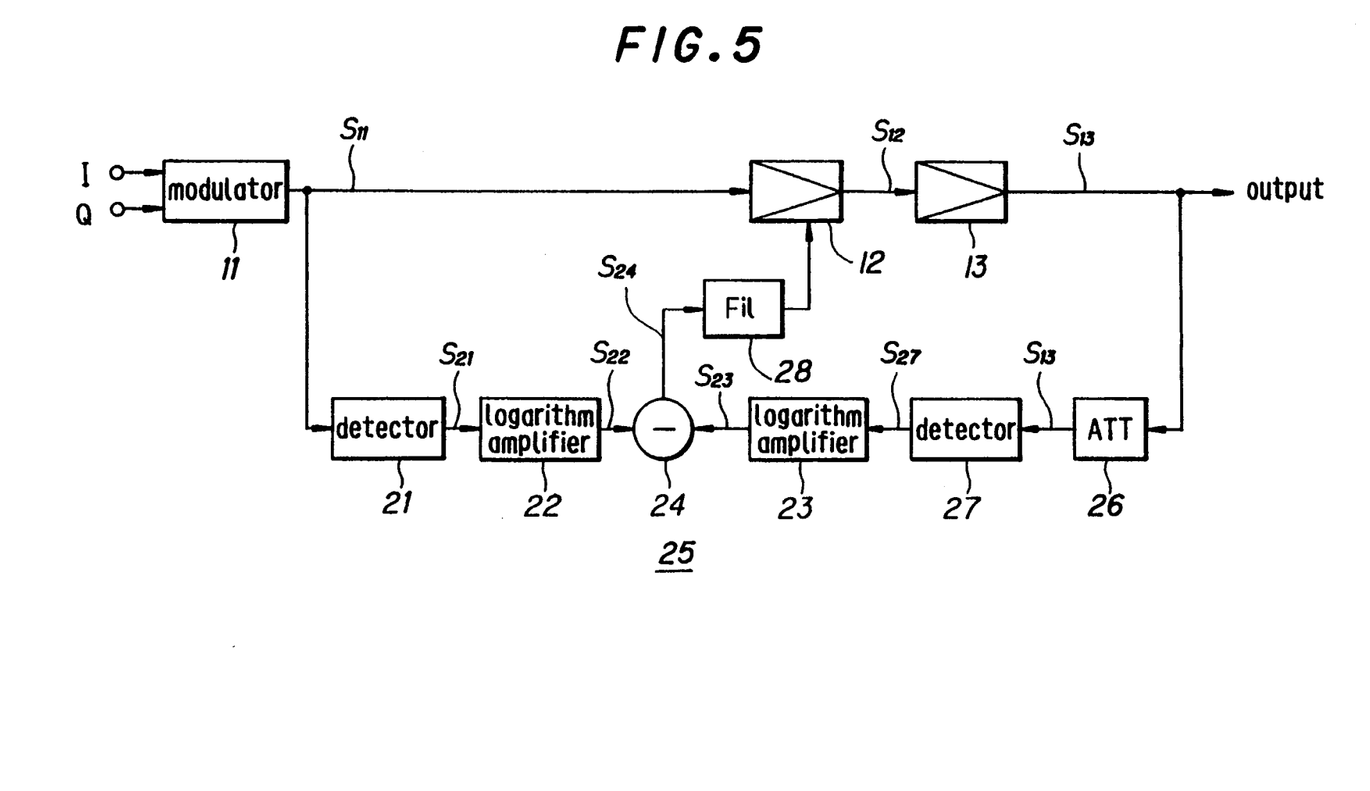
FIG. 5 is a system diagram showing a preferred embodiment of the present invention.

A preferred embodiment of the present invention is illustrated in FIG. 5. In the example shown in FIG. 5, the present invention has been applied to a transmitter circuit for a portable telephone in a digital cellular-phone system. That is, in FIG. 5, digital voice data "I" and "Q" of a base band which has been A/D-converted from a voice signal are supplied to a QPSK modulating circuit 11 and made into, for instance, a QPSK signal S11 in a 900 MHz band. This signal S11 is supplied to a variable gain amplifier 12 and made into a level-controlled signal S12, as will be further discussed later. This signal S12 is supplied to a high-frequency power amplifier 13 for transmission use, power-amplified, and derived as a signal S13.

Figure 6A:
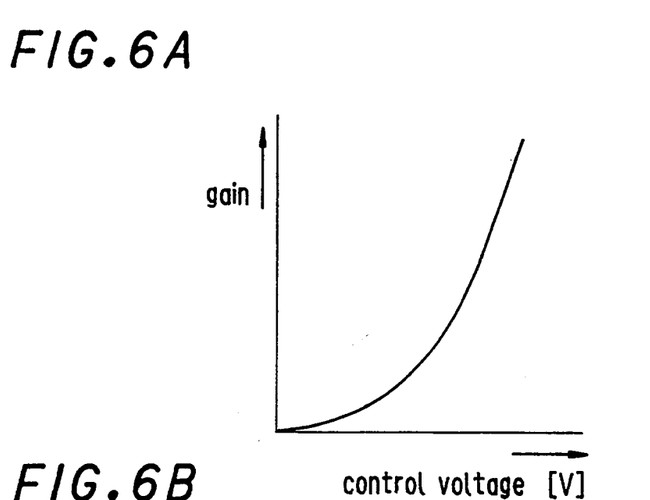
FIGS. 6A and 6B are characteristic diagrams illustrating a portion of the operation of the circuit of FIG. 5.
Figure 6B:
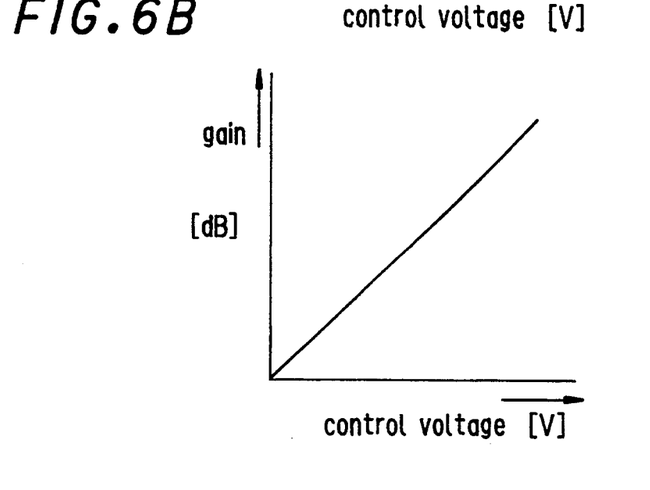

Here, the control voltage vs. gain characteristic of the variable gain control amplifier 12 becomes an inverse logarithm characteristic (exponential characteristic), for example as shown in FIG. 6A, and, as a result, as shown in FIG. 6B, the logarithmic value of the gain with respect to the control voltage becomes linear. It is noted that generally speaking, a variable control amplifier has this kind of control characteristic.

The signal S11 from the modulating circuit 11 is also supplied to an envelope detecting circuit 21 and a detection signal S21 indicative of the envelope waveform of the signal S11 is derived, and this signal S21 is supplied to a logarithm amplifier 22 and converted into a signal S22 indicative of the logarithmic value of the signal S21. Here, this first logarithm amplifier 22 and a second logarithm amplifier 23 and a subtraction circuit 24 constitute a gain detecting circuit 25.

The signal S13 from the power amplifier 13 is supplied to an attenuator circuit 26 and made into a signal S13 having a level corresponding to that of the signal S11. This signal S13 is supplied to an envelope detecting circuit 27, and a detection signal S27 showing the envelope waveform of the signal S13 is derived. This signal S27 is supplied to the logarithm amplifier 23 and converted into a signal S23 indicative of the logarithmic value of the signal S27. The signals S22 and S23 from the logarithm amplifiers 22 and 23 are then supplied to a subtraction circuit 24, and a differential (subtraction) signal S24 between both of these signals is derived as follows:

$$S24 = S22 - S23 \quad (1)$$

This signal S24 is supplied via a loop filter 28 to a variable gain amplifier 12 as a control voltage thereof.

Figure 7:
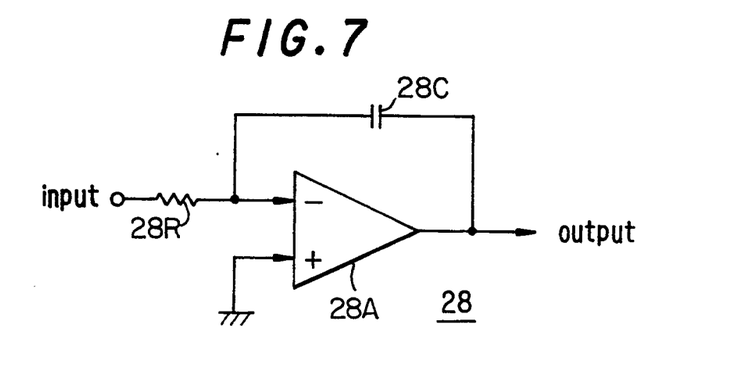
FIG. 7 is a connection diagram showing an example construction of a portion of the circuit shown in FIG. 1.

It should be noted that the logarithm amplifiers 22 and 23 may be constructed by utilizing the voltage vs. current characteristic of a PN junction. Also, for example as shown in FIG. 7, the loop filter 28 may be constructed from a mirror integrating circuit in which a resistor 28R and a capacitor 28C are connected to an operational amplifier 28A. To briefly explain this arrangement, the signals S21 and S27 are logarithmically converted in the logarithm amplifiers 22 and 23 as follows:

$S22 = k1 * \log(S21)$
$S23 = k1 * \log(S27)$, where k1 is a constant.

These signals are substituted into the formula (1):

$$S24 = k1 * \log(S21) - k1 * \log(S27), = k1 * \log(S21/S27) \quad (2)$$

That is, in the gain detecting circuit 25, the level of the input signal S11 (the envelope detection signal S21) is divided by the level of the output signal S13 (the envelope detection signal S27), and the logarithmic value S24 of the quotient (S21/S27) is outputted.

Then, at this time, since the control voltage vs. gain characteristic of the variable gain amplifier 12 is an inverse logarithm characteristic, assuming now that this characteristic is for example:

$G12 = k2 * \exp(S24)$, where G12 is a gain of the amplifier 12 and k2 is a constant, it becomes:

$$\log(G12) = k3 * S24 \quad (3)$$

where k3 is a constant.

Thus, the formula (2) is substituted into this formula (3):

$$\log(G12) = k3 * k1 * \log(S21/S27) \quad (4)$$

When the constants k1 and k3 are predetermined, the formula (3) becomes:

$\log(G12) = \log(S21/S27)$.

As a result, it becomes:

$G12 = S21/S27$.

In other words, the gain G12 of the variable gain amplifier 12 varies in a linear fashion in proportion to the quotient (S21/S27) between the level of the input signal S12 (envelope detection signal S21) and the level of the output signal S11 (envelope detection signal S27).

Therefore, in the example shown in FIG. 5, as a result of the variable gain amplifier 12 being controlled by the gain detection circuit 25, the negative feedback control system becomes linear.

Figure 8:
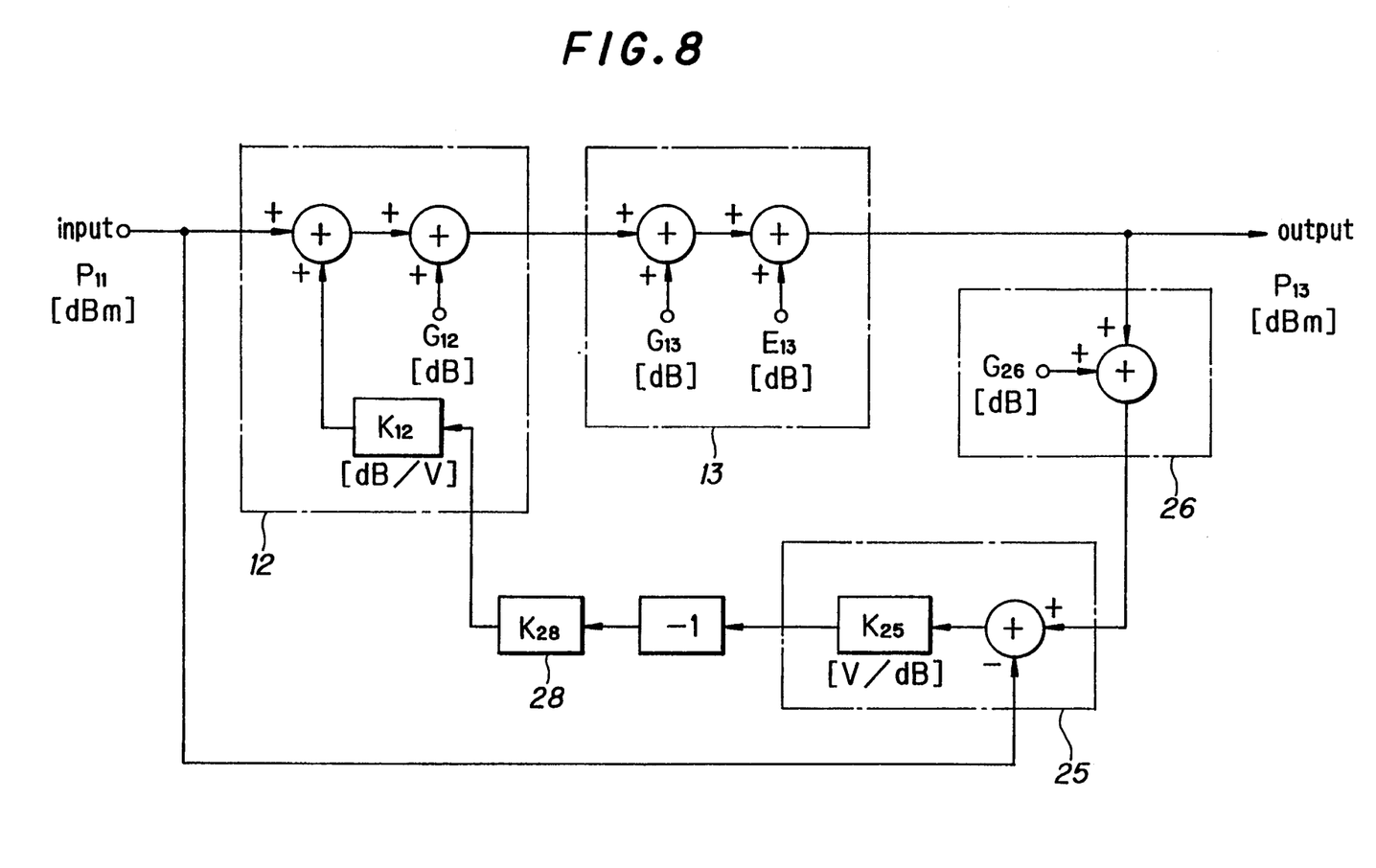
FIG. 8 is a diagram for explaining the operation of the circuit of FIG. 5.

FIG. 8 is a block diagram showing the circuit described above. The transfer functions of the envelope detecting circuits 21 and 27 are 1. Also, P11: power level [dBm] of input signal S11,
P13: power level [dBm] of output signal S13,
G12: gain [dB] of variable gain amplifier 12,
K12: transmission coefficient [dB/V] of variable gain amplifier 12,
G13: gain [dB] of power amplifier 13,
E13: non-linear distortion [dB] of power amplifier circuit 25,
K25: transmission coefficient [V/dB] of gain detection 13,
G26: gain [dB] of attenuator circuit 26,
K28: transfer function of loop filter 28.

Figure 9:
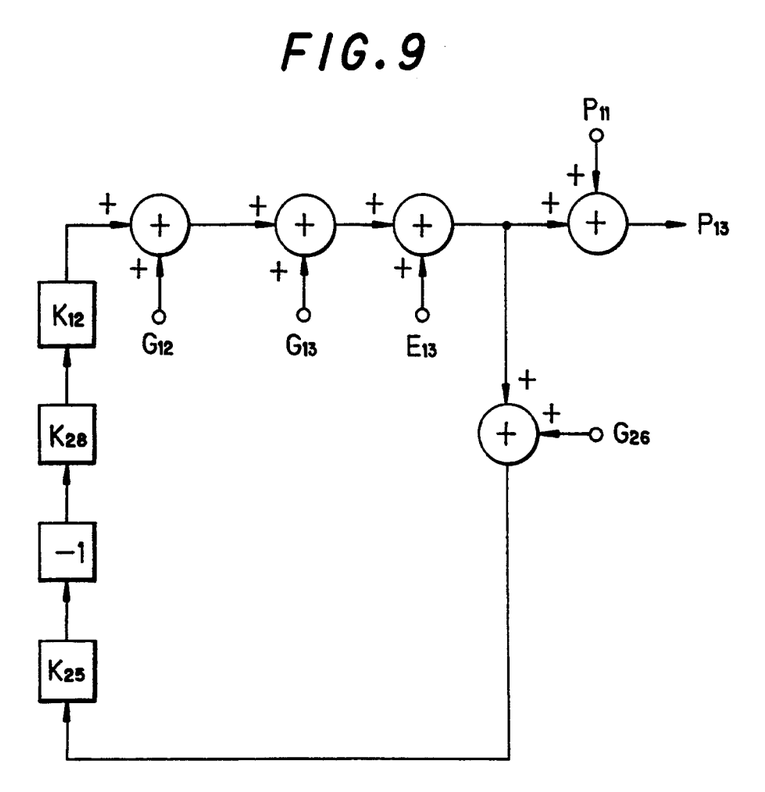
FIG. 9 is a diagram for explaining the operation of the circuit shown in FIG. 5.
Figure 10A:
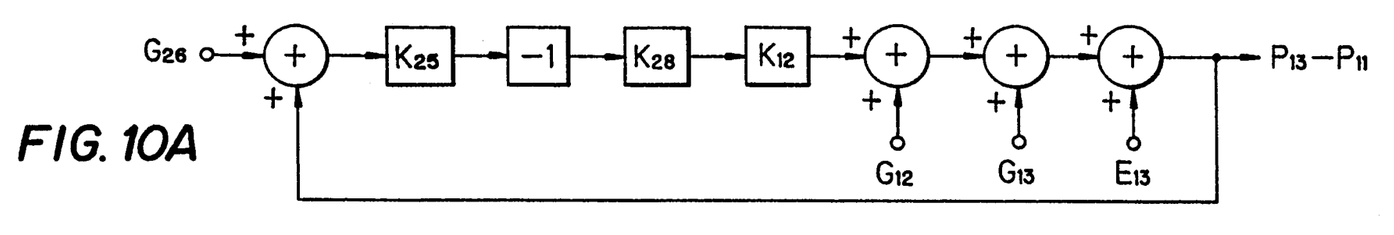
FIG. 10 is a diagram for explaining the operation of the circuit shown in FIG. 5.
Figure 10B:
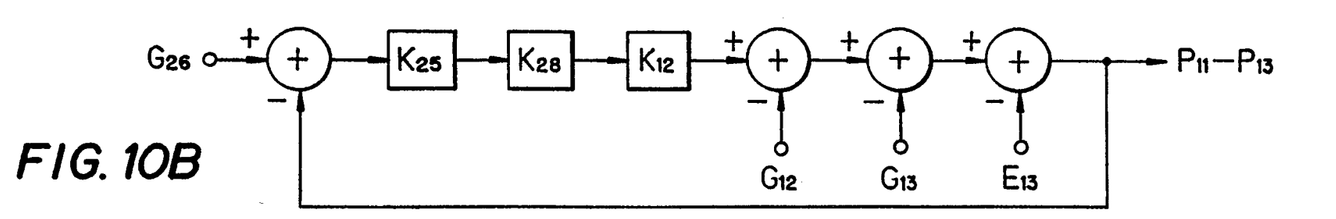
Figure 10C:
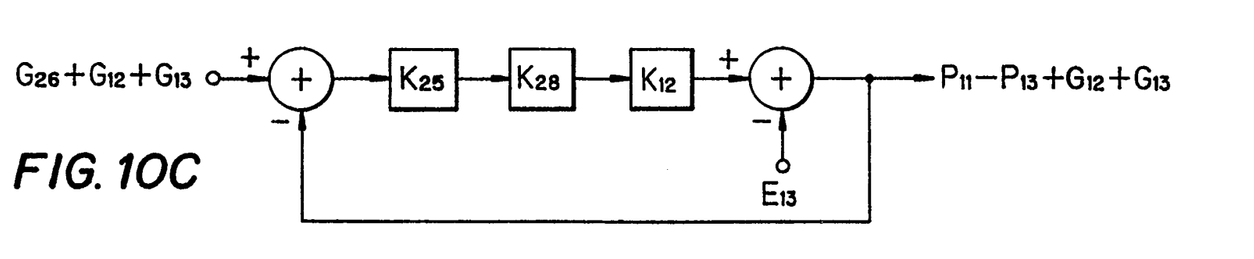

Thus, the block diagram of this FIG. 8 becomes the block diagram of FIG. 9 by equivalent conversion. Furthermore, this block diagram may be rewritten as shown in FIGS. 10A to 10C. The control system of FIG. 10 operates in accordance with:

$$G26+G12+G13=P11-P13+G12+G13$$
$$P13-P11=-G26$$

Namely, the total gain (P13−P11) [d] of the amplifiers 12 and 13 is equal to the attenuation amount (G26) of the attenuator circuit 26. In other words, since the total gain of the amplifiers 12 and 13 is controlled to be equal to the constant value $|G26|$, the non-linear distortion E13 of the power amplifier 13 is compensated.

Figure 10D:
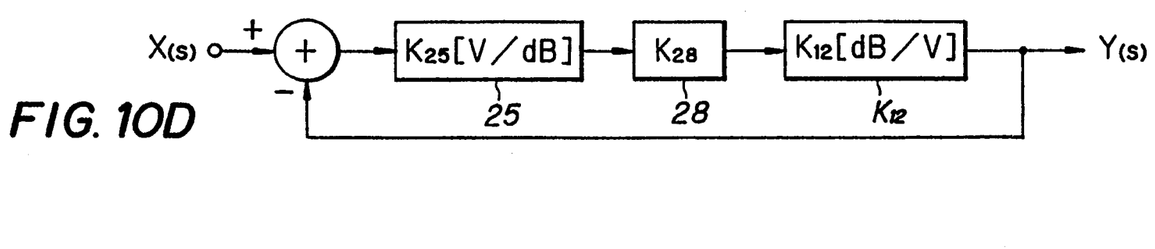

It should be noted that the block diagram of FIG. 10C may be rewritten as shown, in FIG. 10D by thinking of the non-linear distortion E13 of the power amplifier 13 as disturbance. As a result, a close-loop transfer function H(s) and an open-loop transfer function G(s) are given as follows:

$$H(s)=Y(s)/X(s)=K12*K15*K28(1+K12*K25*K28)$$
$$G(s)=K12*K25*K28$$

Figure 11A:
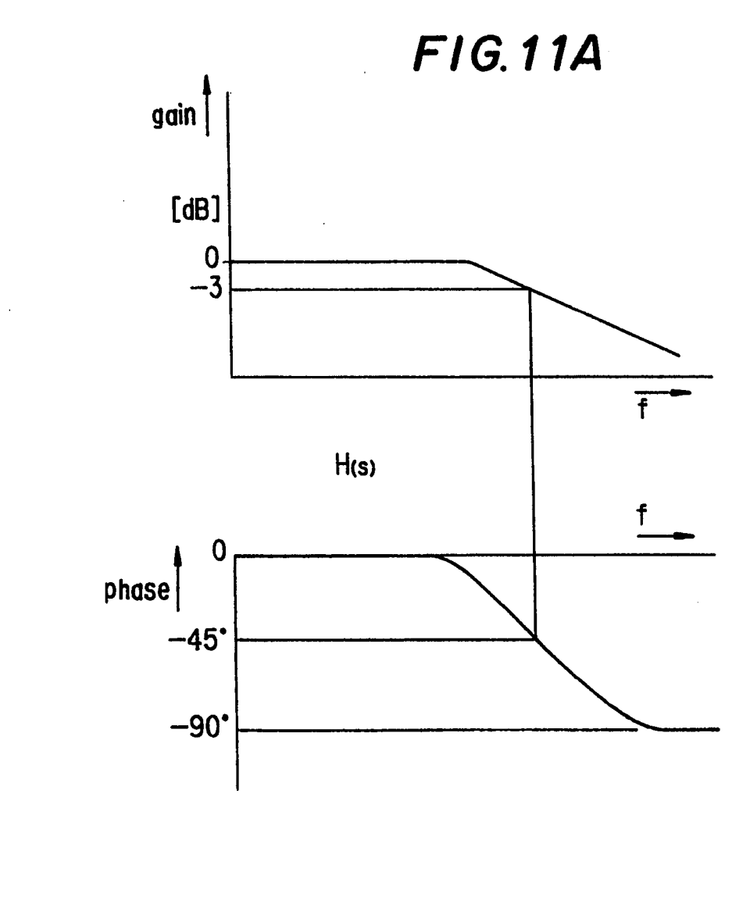
FIGS. 11A and 11B are diagrams for explaining the operation of the circuit shown in FIG. 5.
Figure 11B:
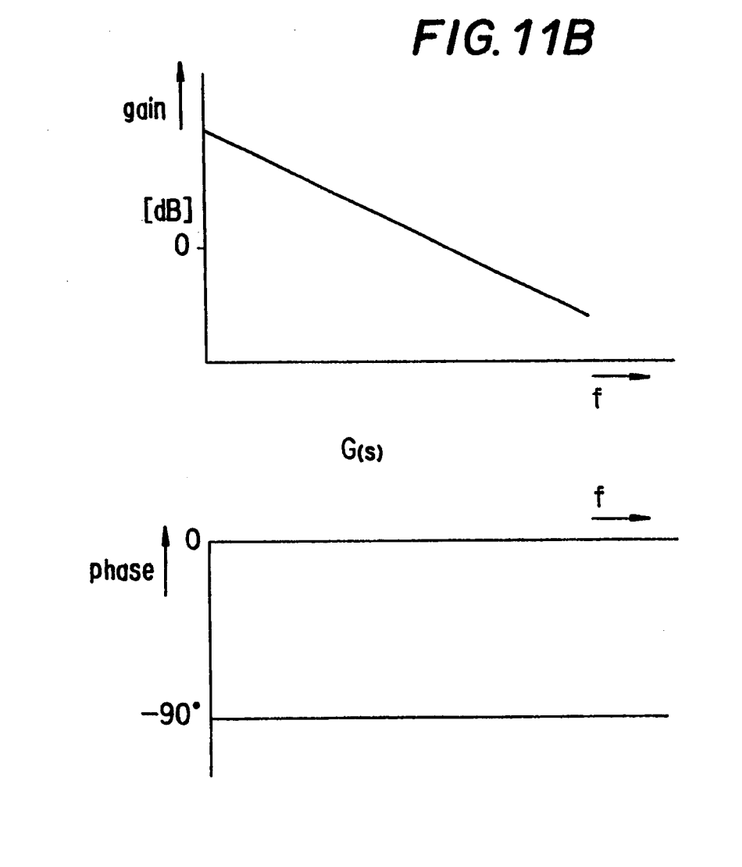

Illustrating H(s) and G(s) as examples, FIG. 11A and FIG. 11B are obtained.

As described above, according to the present invention, since it is conceived that the non-linear distortion occurring in the power amplifier 13 is caused by the gain error of the power amplifier 13, the gain error is detected, and the level of the signal S12 inputted to the power amplifier 13 is corrected based upon the detected output, even when the input/output characteristic of the power amplifier 13 is a non-linear characteristic, the non-linear distortion caused by this non-linear characteristic can be compensated.

And, although this compensating method corresponds to the negative feedback method in a broad sense, since the gain error of the power amplifier 13 is detected in a logarithmic value state, and the gain of the variable gain amplifier 12 having the inverse logarithm characteristic is controlled by this detection signal, as shown in FIG. 11 the system becomes a linear control system. Accordingly, since a sufficient loop gain may be obtained, the distortion compensating characteristic hardly deteriorates at all with respect to the temperature characteristics and age deterioration, and this distortion compensation is reliably achieved. For instance, there is a circuit which produces a direct current offset within the negative feedback loop, and no adjustment of this direct current offset is required. Also, when either the power source voltage of the power amplifier 13 has been made low, or the power source voltage has changed, even if distortion happens to occur in the power amplifier 13, since this distortion is also compensated, the efficiency of the power amplifier 13 can be increased.

Figure 12:
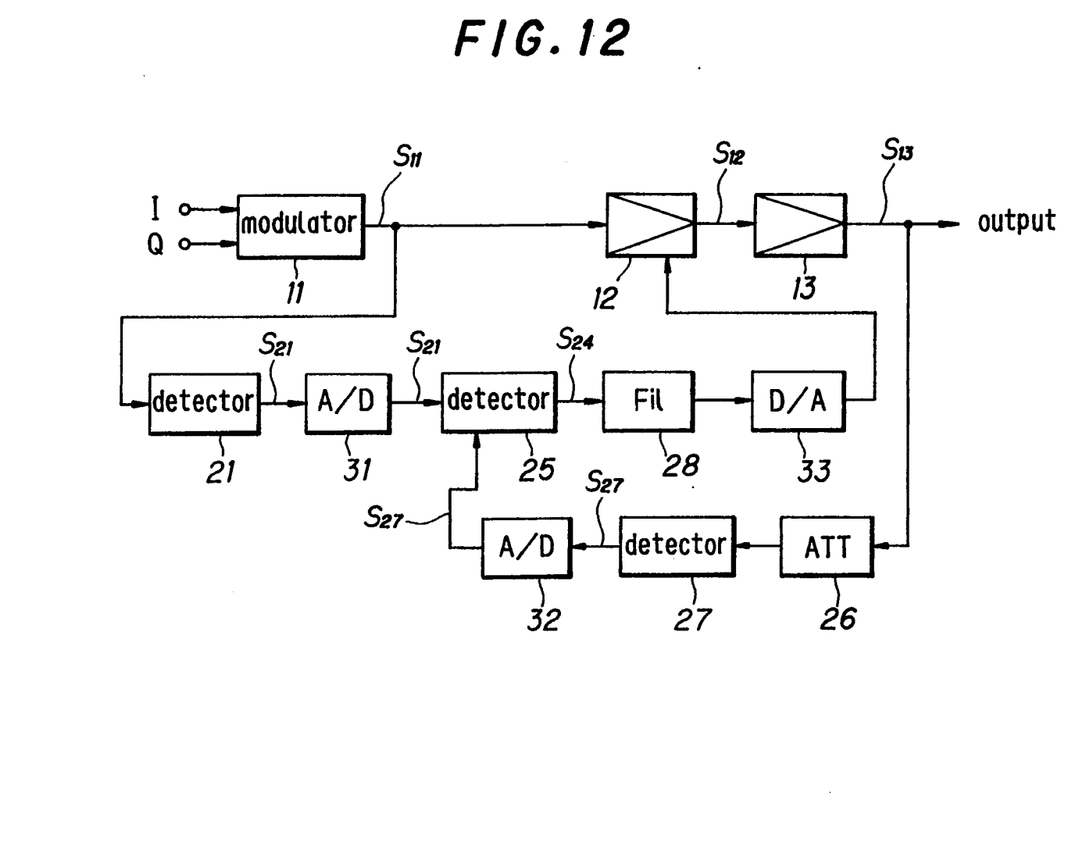
FIG. 12 is a system diagram showing another preferred embodiment of the present invention.

FIG. 12 shows a second preferred embodiment of the present invention. Features in FIG. 12 which are the same as features in FIG. 5 have been given the same reference numerals, and their detailed description will be omitted here. In this FIG. 12, distortion compensation is performed by way of a digital process. That is, the detection signals S21 and S27 are A/D-converted by A/D converters 31 and 32, a gain detecting circuit 25 and a loop filter 28 are made digital, and after the output signal of the filter 28 has been converted into an analog signal by a D/A converter 33, this analog signal is supplied to the variable gain amplifier 12 as a control voltage.

Consequently, with this example, because the negative feedback loop becomes more stable than the above example with respect to the temperature characteristics and age deterioration, fluctuations do not readily occur, and distortion compensation can be performed more reliably than with the above-described example. Moreover, even when the control voltage vs. gain characteristic of the variable gain amplifier 12 deviates from the inverse logarithm characteristic of FIG. 6A, deviations in the characteristic of the amplifier 12 may be compensated for by correcting the output signal of the filter 28 which is supplied to the amplifier 12 as the control voltage.

Figure 13:
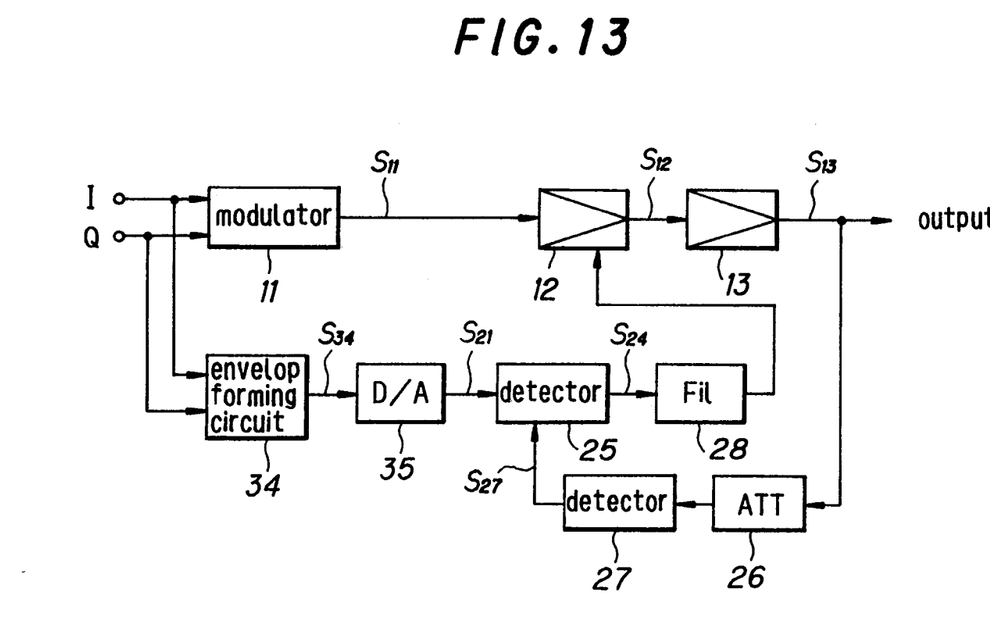
FIG. 13 is a system diagram showing another preferred embodiment of the present invention.

FIG. 13 shows a third preferred embodiment of the present invention. Features in FIG. 13 which are the same as features in FIG. 5 have been given the same reference numerals, and their detailed description will be omitted here. In FIG. 13, base band digital voice data I and Q which are supplied to a QPSK modulating circuit 11 are supplied to an envelope forming circuit 34, and a digital signal S34 representative of the envelope waveform of the modulation signal S11 is formed. This signal S34 is supplied to a D/A converter 35 and an analog signal indicative of the envelope waveform of the modulation signal S11, namely a signal S21, is derived. Then, this signal S21 is supplied to a gain detecting circuit 25. As a result, distortion occurring in the amplifier 13 can be similarly compensated.

Figure 14:
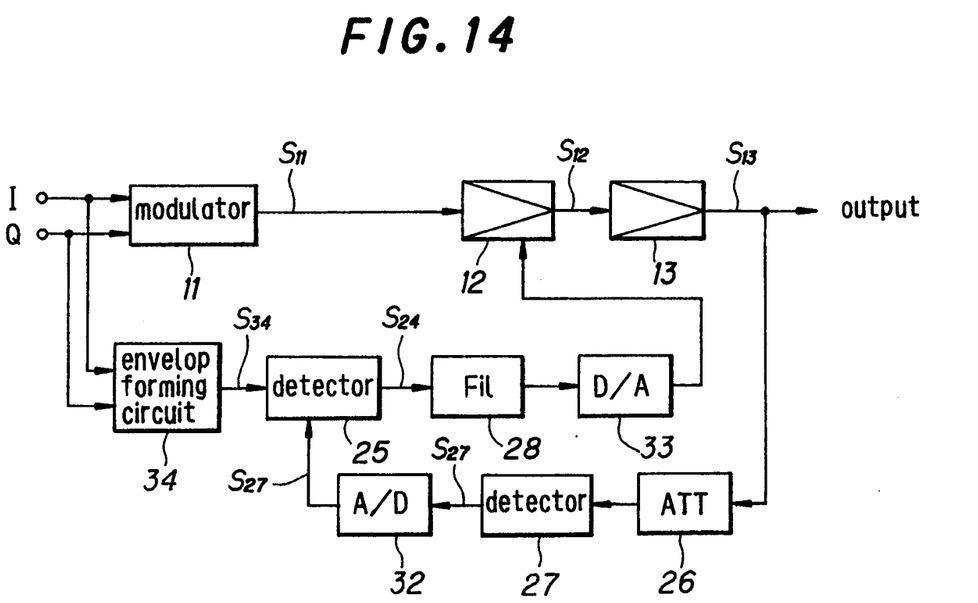
FIG. 14 is a system diagram showing another preferred embodiment of the present invention.

FIG. 14 shows a fourth preferred embodiment of the present invention. Features in FIG. 14 which are the same as features in FIG. 5 have been given the same reference numerals, and their detailed description will be omitted here. In FIG. 14, because the digital signal S34 representative of the envelope waveform of the modulation signal S11 is derived from the envelope forming circuit 34, both an A/D converter 32 and a D/A converter 33 are provided, as in the example of FIG. 12, and also both the gain detecting circuit 25 and the filter 28 are digital circuits, so that the distortion compensation is performed digitally.

Figure 15:
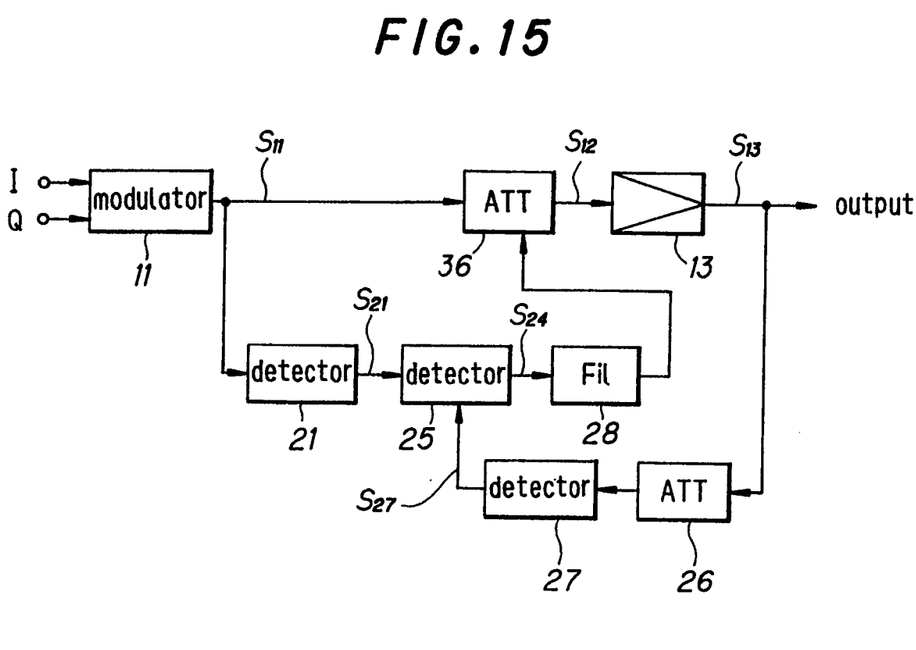
FIG. 15 is a system diagram showing another preferred embodiment of the present invention.

FIG. 15 shows a fifth preferred embodiment of the present invention. Features in FIG. 15 which are the same as features in FIG. 5 have been given the same reference numerals, and their detailed description will be omitted. In this FIG. 15, a variable attenuator circuit 36 is provided as the variable gain circuit instead of the variable gain amplifier 12. The output signal of the filter 28 is supplied as the control voltage to this variable attenuator circuit 36. In this case, it should be noted that the characteristic of the attenuation amount with respect to the control voltage of the variable attenuator circuit 36 is made an inverse logarithm characteristic similar to that of FIG. 6.

According to the present invention, because it is conceived that the non-linear distortion occurring in the power amplifier 13 is caused by the gain errors of the power amplifier 13, and the gain errors are detected, and then the level of the signal S12 inputted to the power amplifier 13 is corrected based upon the detected output, even when the input/output characteristic of the power amplifier 13 is a non-linear characteristic, the non-linear distortion caused by this non-linear characteristic can be compensated.

And, although this compensating method corresponds to the negative feedback method in a broad sense, in accordance with the present invention, because the gain error of the power amplifier 13 is detected in a logarithmic value state, and the gain of the variable gain amplifier 12 having an inverse logarithm characteristic is controlled by this detection signal, the system as shown in FIG. 11 becomes the linear-control system. Accordingly, since a satisfactorily full loop gain may be obtained, the distortion compensating characteristic is not substantially changed with respect to the temperature characteristics and age deterioration, and this distortion compensation is achieved reliably. Also, when the power source voltage of the power amplifier 13 is set to a low voltage, or when the power source voltage has changed, even if distortion is produced in the power amplifier 13, since this distortion is also compensated, the efficiency of the power amplifier 13 can be increased.

What is claimed is:

1. A distortion compensating circuit of a high-frequency power amplifier, for compensating the non-linear distortion of the high-frequency power amplifier by negative feedback, said distortion compensating circuit comprising:

a variable gain circuit provided at a front stage of said high-frequency power amplifier, for variable control of the level of an input signal to said variable gain circuit and for supplying said variably controlled signal to said high-frequency power amplifier;

a gain detecting circuit for detecting the gain of said high-frequency power amplifier and said variable gain circuit; and a loop filter for supplying an output signal of said gain detecting circuit to said variable gain circuit as a control voltage thereof;

wherein said gain detecting circuit includes:

a first logarithm converting circuit for logarithmically converting an envelope detection signal of the variably controlled signal inputted into said variable gain circuit;

a second logarithm converting circuit for logarithmically converting an envelope detection signal of an output signal from said high-frequency power amplifier; and a subtraction circuit for outputting a subtraction signal of the respective output signals of said first and second logarithm converting circuits;

and wherein the control voltage vs. gain characteristic of said variable gain circuit is an inverse logarithm characteristic.

2. A distortion compensating circuit of a high-frequency power amplifier as claimed in claim 1, wherein said variable gain circuit comprises a variable gain amplifier circuit.

3. A distortion compensating circuit of a high-frequency power amplifier according to claim 1, wherein the envelope detection signals supplied to said gain detecting circuit are digital signals;

said gain detecting circuit and said loop filter are digital circuits; and the output signal to be supplied to said variable gain circuit from said loop filter is D/A converted before being supplied as a control signal to said variable gain circuit.

4. A distortion compensating circuit of a high-frequency power amplifier, for compensating non-linear distortion of the high-frequency power amplifier by way of negative feedback, said distortion compensating circuit comprising:

a modulating circuit;

a variable gain circuit for controlling the output signal of the modulating circuit to a variably controlled level, and supplying it to said high-frequency power amplifier;

a gain detecting circuit for detecting the gain of said high-frequency power amplifier and said variable gain circuit; and a loop filter for supplying the output signal of said gain detecting circuit to said variable gain circuit as a control voltage thereof;

wherein said gain detecting circuit includes:

a first logarithm converting circuit for logarithmically converting an envelope detection signal of the signal outputted from said modulating circuit;

a second logarithm converting circuit for logarithmically converting an envelope detection signal of the output signal from said high-frequency power amplifier; and a subtraction circuit for outputting a subtraction signal of the respective output signals of said first and second logarithm converting circuits;

and wherein the control voltage vs. gain characteristic of said variable gain circuit is an inverse logarithm characteristic.

5. A distortion compensating circuit of a high-frequency power amplifier according to claim 4, wherein the envelope detection signals supplied to said gain detecting circuit are digital signals;

said gain detecting circuit and said loop filter are digital circuits; and the output signal of said loop filter is D/A converted before being supplied as a control signal to said variable gain circuit.

* * * * *